(12) United States Patent
Tago et al.

(10) Patent No.: US 6,583,514 B2
(45) Date of Patent: Jun. 24, 2003

(54) SEMICONDUCTOR DEVICE WITH A BINARY ALLOY BONDING LAYER

(75) Inventors: Masamoto Tago, Tokyo (JP); Yoshihiro Tomita, Tokyo (JP); Kenji Takahashi, Ibaraki (JP)

(73) Assignees: NEC Corporation, Tokyo (JP); Mitsubishi Denki Kabushiki Kaisha, Tokyo (JP); Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/969,657

(22) Filed: Oct. 4, 2001

(65) Prior Publication Data

US 2002/0090756 A1 Jul. 11, 2002

(30) Foreign Application Priority Data

Oct. 4, 2000 (JP) ........................................ 2000-304708

(51) Int. Cl.[7] .......................... H01L 23/48; H01L 23/52; H01L 29/40
(52) U.S. Cl. ..................... 257/778; 257/685; 257/686; 257/723; 257/773; 257/777; 257/778; 257/779; 257/786
(58) Field of Search ................................ 257/777, 685, 257/686, 723, 778, 779, 786, 773

(56) References Cited

U.S. PATENT DOCUMENTS

| 3,577,037 A | * | 5/1971 | Di Pietro et al. ............ 257/621 |
| 4,122,479 A | * | 10/1978 | Sugawara et al. ............. 257/82 |
| 4,754,316 A | * | 6/1988 | Reid ........................... 257/777 |
| 4,897,708 A | | 1/1990 | Clements ..................... 257/690 |
| 5,229,647 A | | 7/1993 | Gnadinger ................... 257/785 |
| 5,640,052 A | * | 6/1997 | Tsukamoto .................. 257/781 |
| 5,656,858 A | * | 8/1997 | Kondo et al. ................ 257/737 |
| 5,956,605 A | * | 9/1999 | Akram et al. ............... 438/613 |
| 6,184,060 B1 | | 2/2001 | Siniaguine .................. 438/106 |
| 6,229,209 B1 | * | 5/2001 | Nakamura et al. .......... 257/737 |
| 6,278,184 B1 | * | 8/2001 | Brofman et al. ............. 257/737 |
| 6,337,522 B1 | * | 1/2002 | Kang et al. .................. 257/784 |
| 6,423,561 B1 | * | 7/2002 | Chino et al. .................. 438/29 |
| 6,456,099 B1 | * | 9/2002 | Eldridge et al. ............. 324/754 |
| 2001/0013655 A1 | * | 8/2001 | Smith ......................... 257/741 |
| 2002/0030261 A1 | * | 3/2002 | Rolda, Jr. et al. ........... 257/685 |

FOREIGN PATENT DOCUMENTS

| JP | 59-218744 | 12/1984 |
| JP | 64-81264 | 3/1989 |
| JP | 3-276750 | 12/1991 |
| JP | 4-225542 | 8/1992 |
| JP | 6-112402 | 4/1994 |
| JP | 7-142490 | 6/1995 |
| JP | 10-242383 | 9/1998 |
| JP | 2000-114313 | 4/2000 |
| TW | 447060 | 7/2001 |

* cited by examiner

*Primary Examiner*—Amir Zarabian
*Assistant Examiner*—Ida M. Soward
(74) *Attorney, Agent, or Firm*—Young & Thompson

(57) ABSTRACT

A semiconductor device includes a semiconductor chip. A substrate is arranged in opposition to the semiconductor chip. A first electrode is placed on the semiconductor chip while a second electrode is placed on the substrate. Each of the first and second electrodes is made of the same electrode material. An intermetallic compound layer is formed between the first electrode and the second electrode. The intermetallic compound layer is entirely a binary alloy of the electrode material and a bonding material that was applied to at least one of the first and second electrodes.

15 Claims, 7 Drawing Sheets

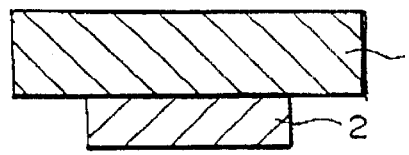
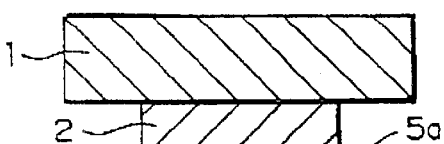
FIG. 1A
PRIOR ART
FIG. 1B
PRIOR ART
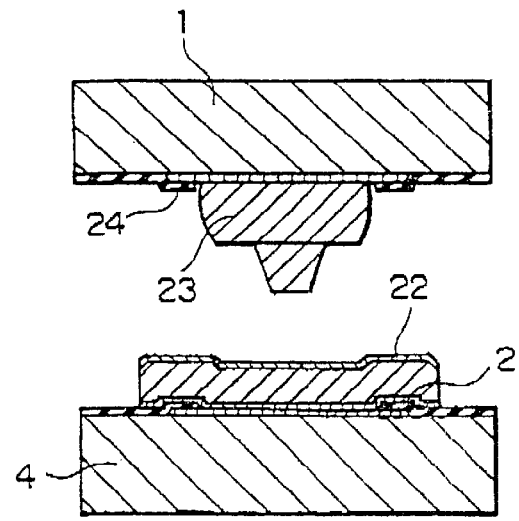
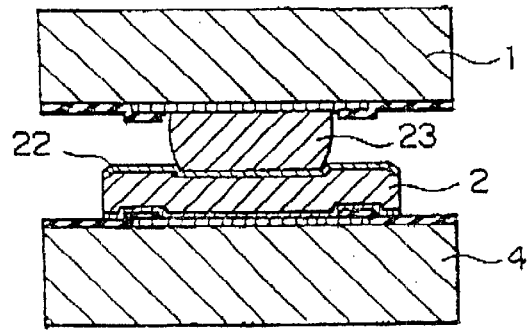
FIG. 2A
PRIOR ART
FIG. 2B
PRIOR ART

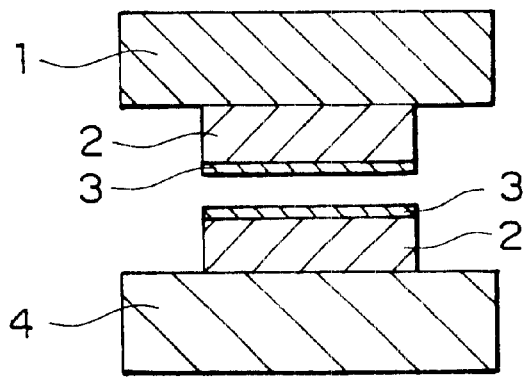
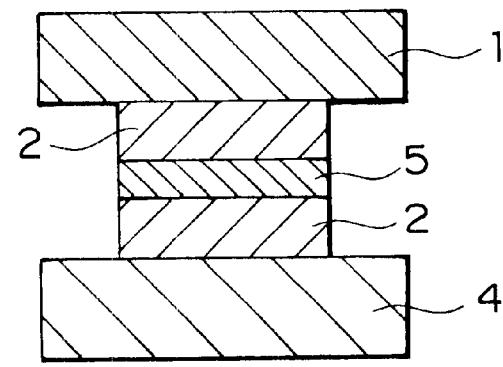
FIG. 3A  FIG. 3B
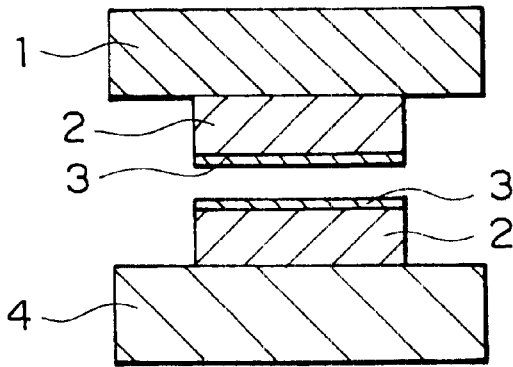
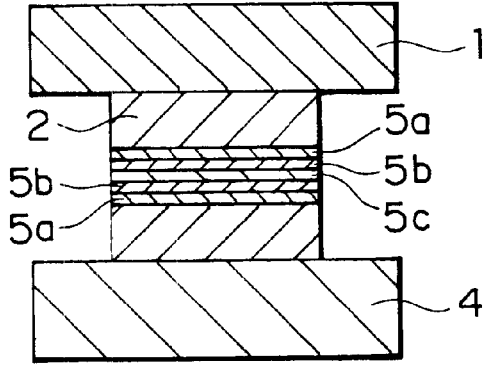
FIG. 4A  FIG. 4B

SEMICONDUCTOR DEVICE WITH A BINARY ALLOY BONDING LAYER

BACKGROUND OF THE INVENTION

This invention relates to a semiconductor device in which an electrode on a semiconductor chip and an electrode on a substrate are electrically connected in opposition to each other, and to a method of manufacturing the same.

More specifically, this invention is directed to a bonding structure of a semiconductor device and a bonding method thereof.

In flip-chip mounting of a semiconductor device, metal bonding is generally used as a connection structure in order to obtain electrical connection.

Here, binary alloy solder including Sn and Pb or hyper-complex solder alloy containing Sn as a major component is often used in such metal bonding.

In particular, a structure referred to as "C4" (control collapse chip connection) is existing as the flip-chop mounting structure.

Referring now to FIGS. 1A and 1B, description will be hereinafter made about such a connection structure as a related art.

A barrier metal with excellent solder wettability, such as, Cu and Ni is used as an electrode 2 on a semiconductor chip 1 and an electrode 2 on a substrate 4 for providing the semiconductor chip 1 thereon.

With such a structure, solder 20 including Sn and Pb is supplied onto the electrode 2 by plating or sputtering, and is melted by heating, then being formed to a spherical shape on the electrode 2.

Thus, a solder bump is formed on the substrate 4, and a semiconductor chip 1 is positioned over the solder bump.

Subsequently, the semiconductor chip 1 is placed over the substrate 4, is melted by heating, and is bonded by the use of the solder 20.

In thus-obtained connection structure, Cu serving as the electrode 2 and Sn serving as the solder 20 are connected by forming intermetallic compound layers 5a and 5b. Thereby, the semiconductor chip 1 and the substrate 4 are electrically connected via the solder 20.

Under this circumstance, the solder 20 serves to form a space between the semiconductor chip 1 and the substrate 4, so that stress concentration, which occurs by a thermal expansion difference between the semiconductor chip 1 and the substrate 4, will be relieved.

In case that the solder 20 serves as eutectic of SnPb, a barrier metal of Ni or CrCu/Cu is used as the electrode 2 of the semiconductor chip 1.

Alternatively, when solder with a high-melting point of Pb 95% Sn 5% is used as the electrode 2, a barrier metal made of Cu will be used.

By adopting such C4 connection, the connection can be carried out only by heating without the load for the electrode 2 or the semiconductor chip 1. With this advantage, the C4 connection will be suitable for mounting an area array semiconductor chip in which electrodes are arranged on a circuit surface.

Further, another suggestion has been made about a contact bonding (solderless) technique of an Au bump using an Au stud bump as the connecting structure for realizing the electrical connection of the flip-chip mounting.

Referring to FIGS. 2A and 2B, description will be made about such a contact bonding technique as another related art.

An Au stud bump 23 is formed on an electrode 24 of a semiconductor chip 1 by the use of Au wire bonding. Further, an electrode 2 of an opposed substrate 4, on which the semiconductor chip 1 will be arranged, is covered with an Au plate 22. In this condition, the Au stud bump 23 and the Au plate 22 are connected to each other by heating and pressing.

Due to this bonding technique, a normally-used Al electrode can be used as the electrode 24 of the semiconductor chip 1. Further, Au is excessively resistant to oxidation. Consequently, the connection can be simply performed by heating and pressing.

However, the above-described connection due to C4 illustrated in FIGS. 1A and 1B is inferior to reliability in keeping under a high temperature or a moisture cycle.

When the eutectic solder is used and Cu is used as the electrode, the electrode of the semiconductor chip is melted or dissolved by the solder by repeatedly heating during assembling or mounting a package. In consequence, adhesion with a base film (an underlying layer) of the electrode will be degraded.

Moreover, the normally-used Al can not be employed as the electrode. Thereby, the electrode having a specific specification becomes necessary, resulting in high cost.

In addition, even when the C4 connection using the eutectic solder is carried out by the use of the barrier metal having the specific specification under used environment of high temperature, the intermetallic compound layer is formed by a solid phase diffusion reaction between the barrier metal and Sn.

Under this circumstance, Sn constituting the solder near the interface and Sn, which is dissolved or melted into Pb, diffuses, so that segregation of Pb takes place near the intermetallic compound layer.

Thus, the intermetallic compound layer and the segregated Pb layer excessively different in mechanical characteristic cause to occur destroy in stress concentration due to the temperature cycle.

On the other hand, the normally-used Al electrode can be employed in such contact bonding using the Au stud bump illustrated in FIGS. 2A and 2B. However, a load or a supersonic wave is used together during forming the Au stud bump, resulting in large impact.

Moreover, the similar structure can be formed by the use of the Au plate. However, the bonding must be carried out by applying a high load under an excessively high temperature within the range 300° C. between 400° C. during bonding so as to cause plastic deformation for the bonding surface and to form a sufficient adhesion surface.

Accordingly, the semiconductor chip may be destroyed or otherwise may be varied in characteristics for the area array semiconductor chip having the electrode on the semiconductor chip (particularly, on the circuit surface), thereby making it difficult to adopt the above-mentioned bonding technique.

SUMMARY OF THE INVENTION

It is therefore an object of this invention to provide a semiconductor device having a stable bonding structure without defects on the condition that reliability is not degraded by high temperature keeping or a temperature cycle in a bonding structure of a semiconductor chip.

It is another object of this invention to provide a method of manufacturing semiconductor device having a stable bonding structure without defects under a low load and a low heating temperature under such a condition that reliability is not degraded by high temperature keeping or a temperature cycle in a bonding structure of a semiconductor chip.

A semiconductor device according to this invention includes a semiconductor chip. With this structure, a substrate is arranged in opposition to the semiconductor chip. A first electrode is placed on the semiconductor chip while a second electrode is placed on the substrate.

Further, an intermetallic compound layer is arranged between the first electrode and the second electrode.

In this event, each of the first and second electrodes is made of predetermined electrode material. The intermetallic compound layer is made of the electrode material and bonding material supplied to at least one of the first and second electrodes.

Here, each of the first and second electrodes preferably has the same shape. For example, the shape may be a convex shape.

The first and second electrodes may be different to each other in dimension. For example, either one of the first and second electrodes has a concave shape while the other one has a convex shape.

The first electrode may be protruded from a surface of the semiconductor chip, and the bonding material is supplied on the first electrode so as to entirely cover the first electrode.

Alternatively, the first electrode is protruded from a surface of the semiconductor chip, and the bonding material is supplied on a top surface of the first electrode.

The bonding material may be supplied to a region having an opening area smaller than an area of either one of the first and second electrodes.

Herein, the substrate may be replaced by another semiconductor chip.

The electrode material may be Cu or Cu alloy while the bonding material may be Sn.

In this case, the electrode material may be at least one selected from the group consisting of nickel, gold and alloy thereof while the bonding material may be at least one selected from the group consisting of tin, indium, antimony, and palladium.

As described above, in the bonding structure according to this invention, the bonding material entirely diffuses so as to form the intermetallic compound layer by the diffusion between the electrode material and the bonding material, thus obtaining the electrical connection between the electrode on the semiconductor chip and the electrode on the substrate.

In consequence, the bonding material layer is not remained at the bonding interface, thereby realizing the structure bonded by the intermetallic compound layer.

According to this invention, the intermetallic compound layer has the precise interface with the electrode formed by diffusion, resulting in high strength in comparison with the above-mentioned related technique.

Further, the bonding material layer is converted into the intermetallic compound layer. Consequently, the soft bonding material is not changed into the intermetallic compound layer like the related technique during practical use under the high temperature environment or the temperature cycle.

Moreover, the bonding material entirely diffuses, making it possible to obtain the bonding portion without defects such as segregation and to improve the reliability.

In the bonding method according to this invention, the single metal material capable of diffusing into the electrode material is used as the bonding material.

Under such a circumstance, the bonding material is excessively thinly supplied onto the electrode. After the positioning, the bonding material entirely diffuses so as to bond via the intermetallic compound layer by pressing and heating.

According to this method, duration for diffusing the bonding material becomes extremely short, and the bonding portion having high reliability can be realized without the load.

BRIEF DESCRIPTION OF THE DRAWINGS

FIGS. 1A and 1B are cross sectional views showing a related bonding structure of a semiconductor device;

FIGS. 2A and 2B are cross sectional views showing a related connection structure and a related connection method of another semiconductor device;

FIGS. 3A and 3B are cross sectional views showing a connection structure and a connection method of a semiconductor device according to a first embodiment of this invention;

FIGS. 4A and 4B are cross sectional views showing another connection structure and another connection method of a semiconductor device according to a first embodiment of this invention;

DESCRIPTION OF PREFERRED EMBODIMENTS (First embodiment)

Figure 5:
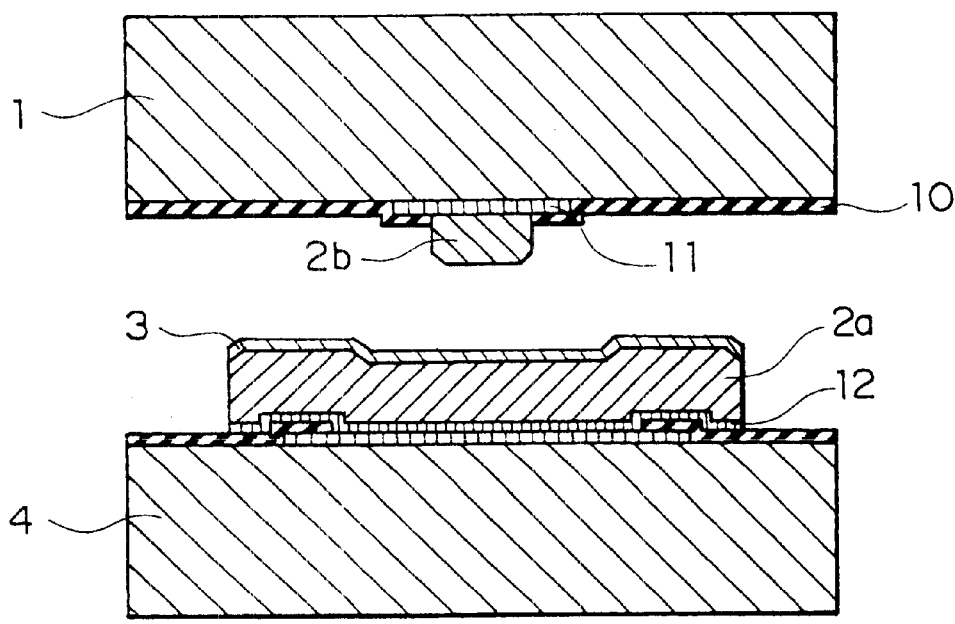
FIG. 5 is a cross sectional view showing a connection structure and a connection method of a semiconductor device according to a second embodiment of this invention.

Referring to FIGS. 3A and 3B, description will be hereinafter made about a first embodiment of this invention.

In FIG. 3A, an electrode 2 on a semiconductor chip 1 is made of Cu while an electrode 2 on a substrate 4 is also made of Cu. On the other hand, bonding material 3 is Sn.

Under this circumstance, the electrodes 2 are positioned so as to be opposed to each other, and a pressure is applied such that Sn surfaces of the bonding material 3 entirely contact to each other, and the bonding material of Sn is heated to a predetermined temperature or higher.

Thereby, reaction between Sn serving as the bonding material 3 and Cu serving as the electrode 2 proceeds to form an intermetallic compound layer 5, as illustrated in FIG. 3B. Consequently, the bonding process is completed.

In such a structure of thus-obtained bonding portion, Sn contributes to entirely alloying with Cu. Thereby, the electrodes 2 made of Cu are bonded to each other via the intermetallic compound layer 5 made of CuSn.

In this state, several intermetallic compound layers with different composition ratios of Cu and Sn are formed to a layered shape in the intermetallic compound layer 5.

Referring to FIGS. 4A and 4B, Sn diffuses into Cu by heating. More specifically, Sn grows into the layers (5a, 5b, and 5c) so as to equalize a Sn concentration grade (slope) in the layer. When the diffusion proceeds sufficiently, Sn will become a single intermetallic compound layer 5.

Thus-formed bonding portion illustrated in FIGS. 3 and 4 is made of binary alloy. Consequently, a segregation layer is not formed different from the connection bonded by the SnPn alloy via the diffusion.

Further, the bonding portion has excessively high reliability for an external stress because of the alloy layer which is uniformly sloped from the interface.

Herein, although the semiconductor chip 1 is bonded with the substrate 4, the semiconductor chip 1 can be bonded with another semiconductor chip in order to achieve the same result.

Moreover, although the intermetallic compound layer 5 is formed by pressing, heating and diffusing as the bonding method, the intermetallic compound layer 5 may be formed with diffusing by heating via a heating layer at a predetermined temperature after preliminary bonding step due to pressing and heating.

In addition, although a pre-process is not performed for the bonding surface of the electrode, gas generated by exciting argon, oxygen or fluorine with plasma may be irradiated, so that organic material or oxide on the surface will be removed so as to perform the bonding process.

(Second embodiment)

Referring to FIG. 5, description will be made about a second embodiment of this invention.

An electrode 2a illustrated in FIG. 5 is produced by sputtering. Further, a groove portion appears at an upper portion of the electrode 2 through an etching process in the cause of a protrusion of a wiring pattern covered with an insulating film 10.

An electrode 2b having smaller area than the groove portion is formed by the use of electroless plating, so that the surface of the electrode 2b is formed to a convex shape, thereby obtaining a desired connection structure.

Figure 6:
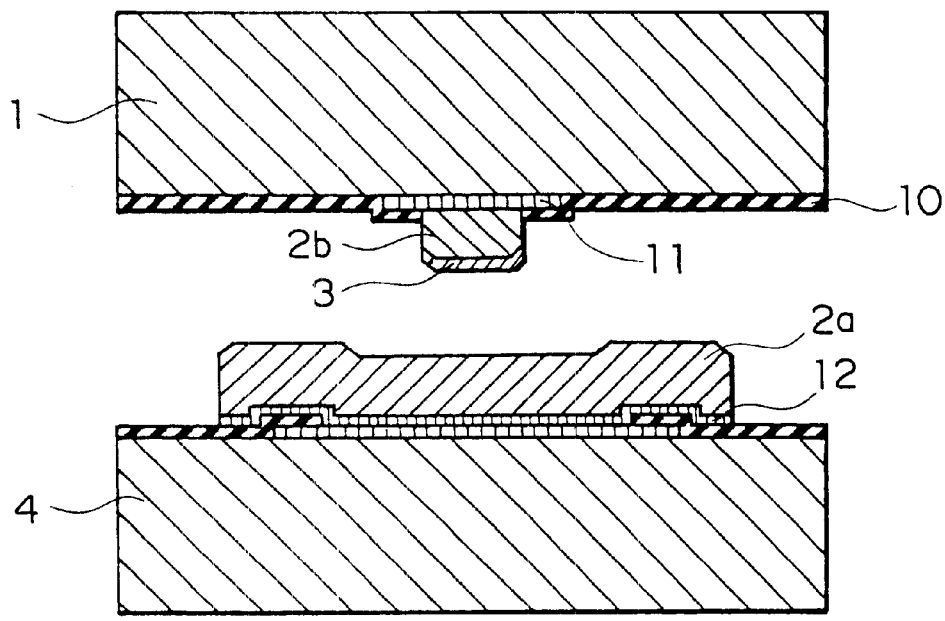
FIG. 6 is a cross sectional view showing another connection structure and another connection method of a semiconductor device according to a second embodiment of this invention.
Figure 7:
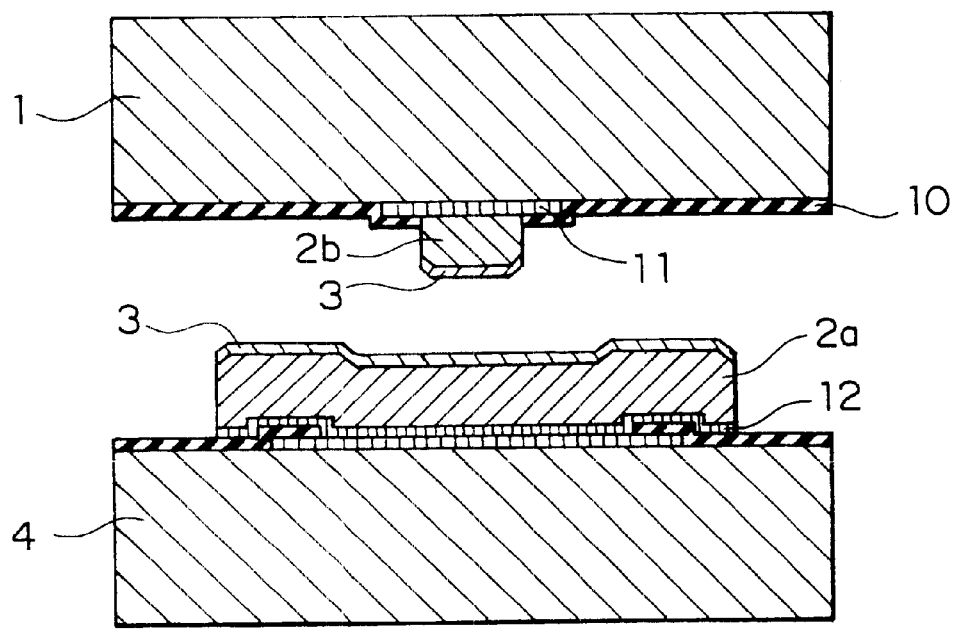
FIG. 7 is a cross sectional view showing another connection structure and another connection method of a semiconductor device according to a second embodiment of this invention.

Herein, although the bonding material 3 is formed only on the electrode 2a in FIG. 5, the bonding material 3 may be formed on at least one of opposed electrodes 2a and 2b, as shown in FIGS. 6 and 7.

More specifically, the bonding material 3 is formed only on the electrode 2b in FIG. 6. On the other hand, the bonding material 3 is formed on both the electrode 2a and the electrode 2b in FIG. 7.

Here, although the electrode 2b having the convex shape is formed by the use of the electroless plating, it may be formed by electrolytic plating so as to obtain a thicker film thickness. Alternatively, the electrode with the convex shape can be formed by the use of other methods.

(Third embodiment)

Figure 8:
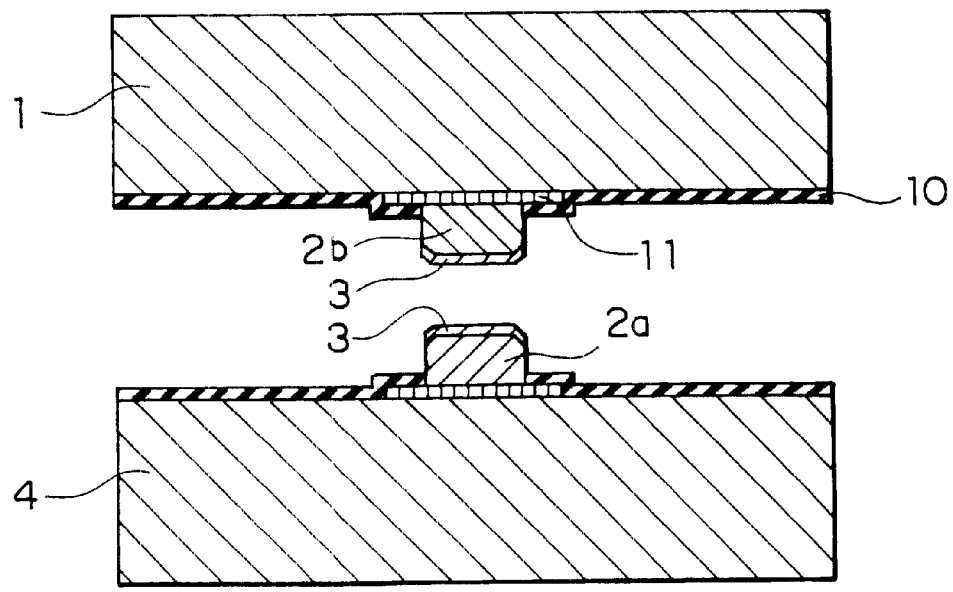
FIG. 8 is a cross sectional view showing a connection structure and a connection method of a semiconductor device according to a third embodiment of this invention.

Referring to FIG. 8, description will be made about a third embodiment of this invention.

Each of opposed electrodes 2a and 2b has the same shape, and is fabricated by the use of the electroless plating. In this event, each of the electrodes 2a and 2b is formed to the convex shape, thus obtaining the bonding portion according to this invention.

Figure 9:
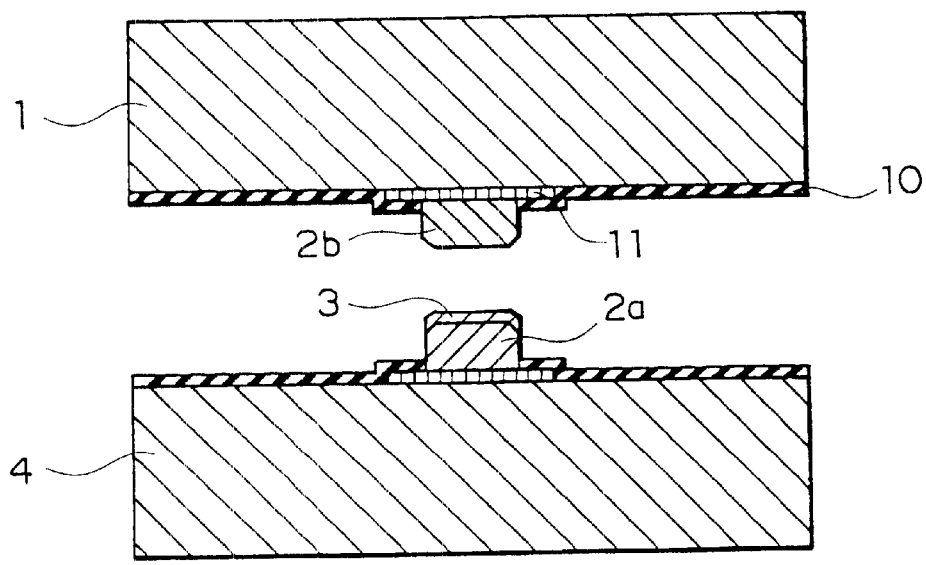
FIG. 9 is a cross sectional view showing another connection structure and another connection method of a semiconductor device according to a third embodiment of this invention.

Although the bonding material 3 are formed on both the electrode 2a and the electrode 2b, the bonding material layer may be formed on either one of the opposed electrodes 2a and 2b in order to achieve the same effect, as illustrated in FIG. 9.

More specifically, the bonding material 3 is formed on the electrode 2a, as shown in FIG. 9.

In this event, although the electrode 2b with the convex shape is formed by the use of the electroless plating, the same effect can be also accomplished in such case where the film thickness is made thicker by the use of electrolytic plating. Alternatively, the electrode having the convex shape can be formed by using the stud bump or the other methods.

Figure 10:
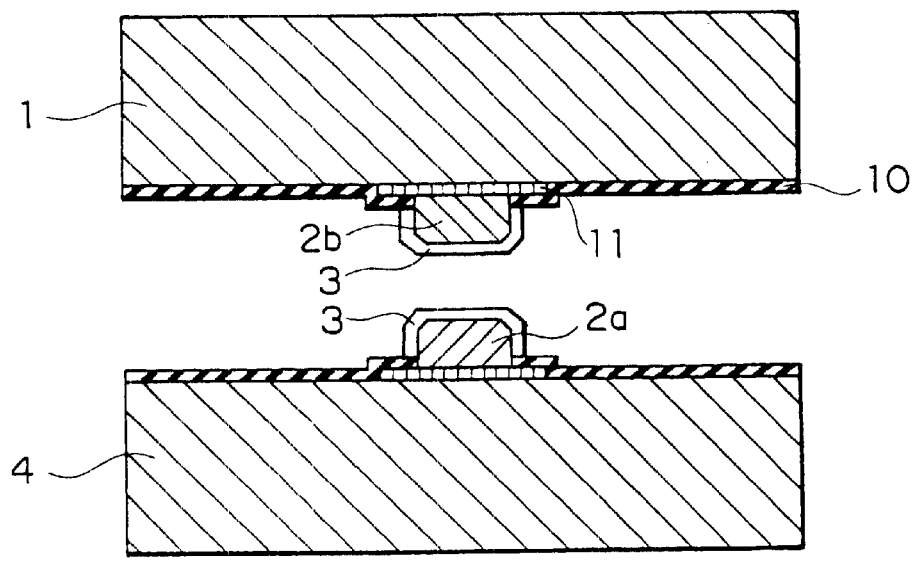
FIG. 10 is a cross sectional view showing another connection structure and another connection method of a semiconductor device according to a third embodiment of this invention.

Further, the bonding material 3 is formed on the upper surface of the electrode 2 in FIG. 9. However, in the case of the protruded electrode, the bonding material 3 may cover the side surfaces in addition to the upper surface, as illustrated in FIG. 10.

Moreover, the bonding material 3 may be formed on a smaller area than the upper surface of the electrode 2. Alternatively, the bonding material 3 may be formed to a semi-spherical shape on the electrode 2 by dropping the bonding material.

Further, when the electrode 2 is formed on the back surface of the semiconductor chip 1 and a plurality of semiconductor chips 1 are mounted, a penetrated electrode 2 is formed so as to be bonded, as illustrated in FIG. 11.

Here, such bonding method will be explained as follows in more detail.

Figure 11A:
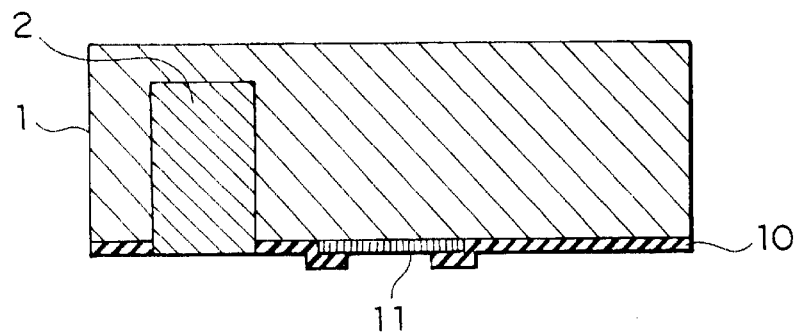
FIGS. 11A through 11D are cross sectional views showing another connection structure and another connection method of a semiconductor device according to a third embodiment of this invention.

First, the electrode 2 is buried into the semiconductor chip 1, as illustrated in FIG. 11A.

Figure 11B:
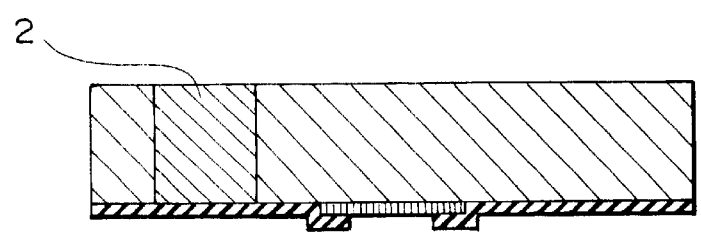

Then, the burred electrode 2 is polished from the back surface, thereby exposing the surface of the electrode 2, as illustrated in FIG. 11B.

Figure 11C:
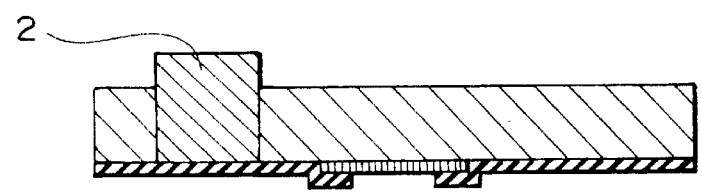
Figure 11D:
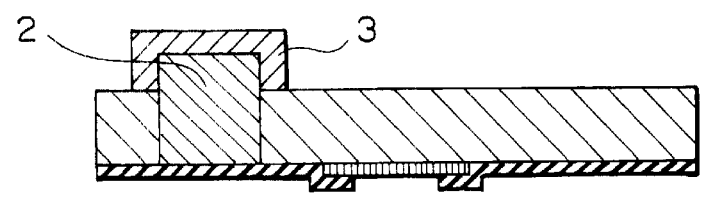

Thereafter, the silicon is selectively etched by dry-etching, thus forming a protruded electrode 2, as illustrated in FIG. 11C Finally, the entire surface of the protruded electrode 2 is plated by the use of electoless Sn plating, and then the bonding material 3 is supplied so as to be bonded with the electrode 2, as illustrated in FIG. 11D.

Subsequently description will be made about another embodiment with reference to FIGS. 12A through D.

Figure 12A:
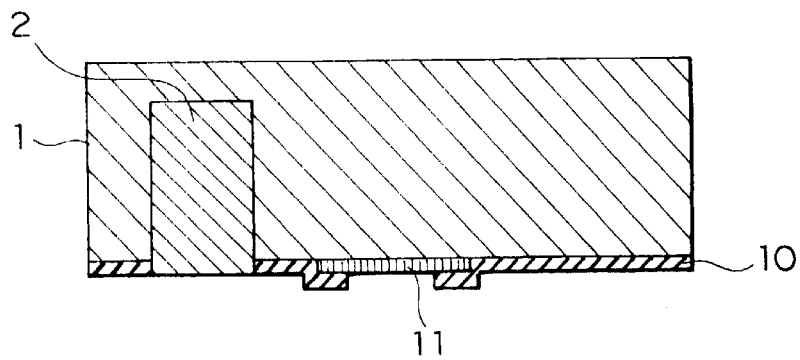
FIGS. 12A through 12D are cross sectional views showing another connection structure and another connection method of a semiconductor device according to a third embodiment of this invention.

First, the electrode 2 is buried into the semiconductor chip 1, as shown in FIG. 12A.

Figure 12B:
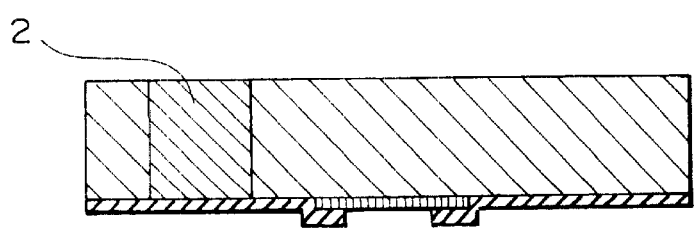

Then, the buried electrode 2 is exposed by the polishing process, as shown in FIG. 12B.

Figure 12C:
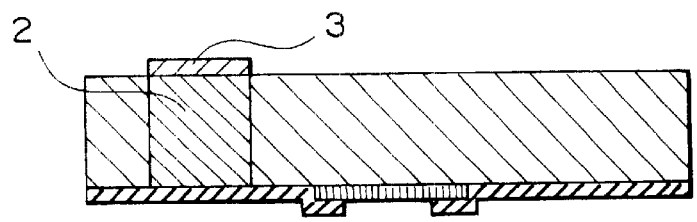

Subsequently, the bonding material 3 is supplied onto the upper surface of the electrode 2, as shown in FIG. 12C.

Figure 12D:
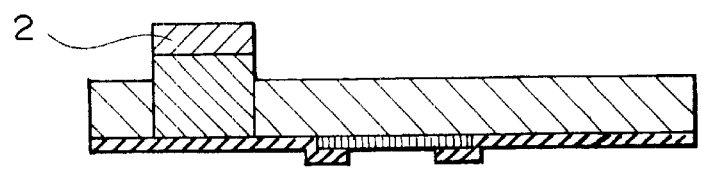

Thereafter, the silicon is selectively etched by dry-etching so as to be bonded with the electrode 2, as shown in FIG. 12D.

In the above-described embodiments, the electrode 2 is made of Cu while the bonding material 3 is Sn. However, the bonding material is not limited to the above material, and may be material such as In for diffusing into the electrode 2 made of Cu in order to form the intermetallic compound layer.

Alternatively, although connection temperature may become higher, the bonding material may be Pb for forming the intermetallic compound layer.

Further, the bonding material may be a single compound such as Ni that dissolves or melts in total ratio, although the intermetallic compound layer made of Sb and Pb is not formed, being capable of obtaining the bonding structure according to this invention.

In addition, Ni or Au can be selected as the electrode 2. In this case, the bonding material will be selected so as to form the intermetallic compound layer with the electrode material.

(Example)

Subsequently, description will be thereinafter made about an example according to this invention with reference to FIGS. 3A and 3B.

Referring back to FIG. 3, the electrode 2 on the semiconductor chip 1 is made of Cu, and has a thickness of 5 µm while the electrode 2 on the substrate 4 is also made of Cu, and has a thickness of 18 µm. Further, the bonding material 3 is Sn, and has a thickness of 0.5 µm.

After the electrodes 2 are aligned to each other, the load is applied such that the Sn surfaces entirely contact to each other, heating at 300° C. of the melting-point of Sn.

Thereby, Sn reacts with Cu of the electrode 2, so that solid solution or the intermetallic compound layer is successively formed with such reaction.

The intermetallic compound 5 formed by the reaction has the melting-point of 300° C. or higher. The bonding portion as liquid phase becomes solid phase by heating at the melting-point or higher, thereby completing the bonding.

In the structure of the thus-obtained bonding portion, Sn entirely contributes to alloying with Cu, and the electrode 2 made of Cu is bonded by the CuSn intermetallic compound layer 5.

In such an intermetallic compound layer 5, several kinds of intermetallic compound layers different in composition ratio between Cu and Sn are formed in the layered shape.

The bonding portion illustrated in FIG. 4 is obtained by continuously heating under the above-mentioned state. Sn diffuses into Cu by heating. Under this circumstance, Sn grows to the layered shape (5a, 5b, and 5c) so as to equalize the Sn concentration slope (grade). When the diffusion sufficiently proceeds, the single intermetallic compound layer 5 is formed finally.

Thus-formed bonding portion of Cu and Sn illustrated in FIGS. 3 and 4 is made of binary alloy. Consequently, a segregation layer is not formed different from the connection bonded by the SnPn alloy via the diffusion.

Further, the bonding portion has excessively high reliability for an external stress because of the alloy layer which is uniformly sloped from the interface.

Herein, the supplied Sn layer has the thickness of 0.5 µm. However, even when the Sn layer has the thickness between 0.5 µm and 2 µm in dependency upon heating time or diffusion time, the bonding portion can be formed with the thickness of 0.5–0.1 µm or less if the contact with the electrode surface is possible depending upon the flatness of the electrode surface.

Further, although the semiconductor chip 1 is bonded with the substrate 2, the semiconductor chip 1 can be bonded with another semiconductor chip under such a condition that the thickness of the electrode 2 is the same as that of the semiconductor chip 1, thus obtaining the same result.

Moreover, although the heating temperature after pressing is selected to the melting-point or higher (300° C.), the bonding structure according to this invention can be also obtained at a temperature of the melting-point or lower.

When the heating temperature is selected to 180° C., the Sn serving as the bonding material 3 is not melted, and the intermetallic compound layer 5 is formed by the diffusion reaction with Cu under solid phase.

In this event, solid solution is not formed because a liquid phase state does not appear. Enough time to form the bonding portion is required to successively form the intermetallic compound layers. Under this circumstance, the uniform intermetallic compound layer 5 can be formed also.

While this invention has thus far been disclosed in conjunction with several embodiments thereof, it will be readily possible for those skilled in the art to put this invention into practice in various other manners.

What is claimed is:

1. A semiconductor device, comprising:
   a semiconductor chip with a first electrode thereon; and
   a substrate with a second electrode thereon,
   wherein said first and second electrodes are the same electrode material, and
   wherein said first and second electrodes are bonded to each other with only a single intermetallic compound layer between said first and second electrodes, the single intermetallic compound layer being a binary alloy of the electrode material and a bonding material.

2. The semiconductor device of claim 1, wherein the electrode material is copper, the bonding material is tin, and the binary alloy is CuSn.

3. The semiconductor device of claim 1, wherein a concentration of the bonding material is the same throughout the single intermetallic compound layer.

4. The semiconductor device of claim 1, wherein the electrode material is selected from the group consisting of copper, nickel, gold and alloys thereof, and the bonding material is selected from the group consisting of tin, indium, antimony, and palladium.

5. The semiconductor device of claim 1, wherein said first and second electrodes have a same shape.

6. The semiconductor device of claim 5, wherein said shape is convex.

7. The semiconductor device of claim 1, wherein said first and second electrodes have different dimensions.

8. The semiconductor device of claim 7, wherein one of said first and second electrodes has a convex shape and the other of said first and second electrodes has a concave shape.

9. A semiconductor device, comprising:
   a semiconductor chip with a first electrode thereon; and
   a substrate with a second electrode thereon,
   wherein said first and second electrodes are the same electrode material, and
   wherein said first and second electrodes are bonded to each other with only plural intermetallic compound layers between said first and second electrodes, the intermetallic compound layers being a binary alloy of the electrode material and a bonding material.

10. The semiconductor device of claim 9, wherein the electrode material is copper, the bonding material is tin, and the binary alloy is CuSn.

11. The semiconductor device of claim 9, wherein the electrode material is selected from the group consisting of copper, nickel, gold and alloys thereof, and the bonding material is selected from the group consisting of tin, indium, antimony, and palladium.

12. The semiconductor device of claim 9, wherein said first and second electrodes have a same shape.

13. The semiconductor device of claim 12, wherein said shape is convex.

14. The semiconductor device of claim 9, wherein said first and second electrodes have different dimensions.

15. The semiconductor device of claim 14, wherein one of said first and second electrodes has a convex shape and the other of said first and second electrodes has a concave shape.

* * * * *